United States Patent [19]

Hooper

[11] Patent Number: 4,720,841

[45] Date of Patent: Jan. 19, 1988

[54] MULTI-CHANNEL VOLTAGE-TO-FREQUENCY CONVERTOR

[75] Inventor: William P. Hooper, Largo, Fla.

[73] Assignee: Square D Company, Palatine, Ill.

[21] Appl. No.: 734,740

[22] Filed: May 15, 1985

[51] Int. Cl.$^4$ .................. G01R 21/06; H03M 1/56
[52] U.S. Cl. .................................... 377/20; 377/42; 377/55; 377/111; 364/483; 340/347 NT
[58] Field of Search .................. 377/111, 42, 55, 20; 364/483; 340/347 NT

[56] References Cited

U.S. PATENT DOCUMENTS

| | | | |
|---|---|---|---|
| 3,686,665 | 8/1972 | Elias et al. | 340/347 NT |
| 3,701,146 | 10/1972 | Haga et al. | 340/347 NT |
| 3,710,374 | 1/1973 | Kelly | 340/347 NT |
| 3,760,407 | 9/1973 | Terry | 340/347 NT |
| 3,918,050 | 11/1975 | Dorsman | 340/347 NT |
| 4,024,533 | 5/1977 | Neumann | 340/347 NT |
| 4,224,671 | 9/1980 | Sugiyama et al. | 340/347 NT |
| 4,356,553 | 10/1982 | Steinle et al. | 364/483 |
| 4,573,037 | 2/1986 | Robinton et al. | 377/42 |
| 4,588,984 | 5/1986 | Dorsman | 340/347 NT |

OTHER PUBLICATIONS

"Combined ADC-DAC" by Bares et al., IBM Technical Disclosure Bulletin, vol. 10, No. 9, Feb. 1968.

Primary Examiner—John S. Heyman
Attorney, Agent, or Firm—A. Sidney Johnston

[57] ABSTRACT

A circuit for providing an indication of watt-hours from a voltage input that is an analog of watts comprises a source of a high-frequency square wave and a precision triangular wave at a frequency that is derived from the high-frequency square wave by frequency division. A time interval is derived by selecting a period between a time when the triangular wave crosses zero volts and the time at which the amplitude of the triangular wave equals the analog input voltage. A count of the number of cycles of the high-frequency signal during that interval provides a measure of the value of the input voltage, and a continuing count of that number of cycles provides a time-integrated value of the count. When the input signal is analogous to watts, the integrated output provides a measure of watt-hours.

5 Claims, 3 Drawing Figures

MULTI-CHANNEL VOLTAGE-TO-FREQUENCY CONVERTOR

BACKGROUND OF THE INVENTION

This invention is an improved voltage-to-frequency (V/F) convertor. In particular, it is a V/F convertor that uses a single precision frequency source to provide accuracy over a relatively wide range of input voltages for a plurality of V/F measurements.

Measurements of energy, power, reactive volt-amperes (VARs) and VAR-hours call for a high degree of accuracy of measurements over a wide range of input values. Various means have been used to obtain a voltage that is proportional either to power or reactive volt-amperes. One such means is shown in U.S. Pat. No. 4,498,138 entitled "Electronic Watt/Var Transducer", which is incorporated here by reference as if set forth fully.

In a particular application it was desirable to provide indications of watt-hour activity on three separate power systems. A voltage proportional to the power level in each of the systems was available for use. Each of these signals needed some form of time integration to provide a measure of the energy consumed in units of watt-hours. A system being monitored might operate at full power or at a very low power level, but the measurement needed to be made with the same accuracy for each.

Although the system in question called for monitoring of three channels, it may become desirable to add more channels at minimum expense.

SUMMARY OF THE INVENTION

It is an object of the present invention to provide a better means of providing an output corresponding to an input voltage.

It is a further object of the present invention to provide a voltage-to-frequency convertor for a precision measurement of the input voltage.

It is a further object of the present invention to provide a voltage-to-frequency convertor that monitors a plurality of channels with a single precision source.

Other objects will become apparent in the course of a detailed description of the invention.

A voltage-to-frequency convertor comprises an oscillator/divider that produces a high-frequency signal and two lower-frequency signals, one at a clock frequency and one at twice the clock frequency. The latter two signals are obtained by frequency division from the high-frequency signal. The clock signal is coupled to a precision triangular wave generator and a zero-crossing detector, while the signal at twice clock frequency is also coupled to the zero-crossing detector. A counter is enabled to count the high-frequency signals during the time intervals between a zero crossing of the precision triangular wave and the time at which the precision triangular wave achieves a level equal to the input voltage level. This effects a conversion from voltage to counts of the high-frequency signal, which can be taken as a frequency output corresponding to power or can be integrated to provide a measure of watt-hours. The elements just described are readily extended to control a plurality of counters, each corresponding to a different voltage input that is proportional to the power level in a different system.

DETAILED DESCRIPTION OF THE INVENTION

Figure 1:
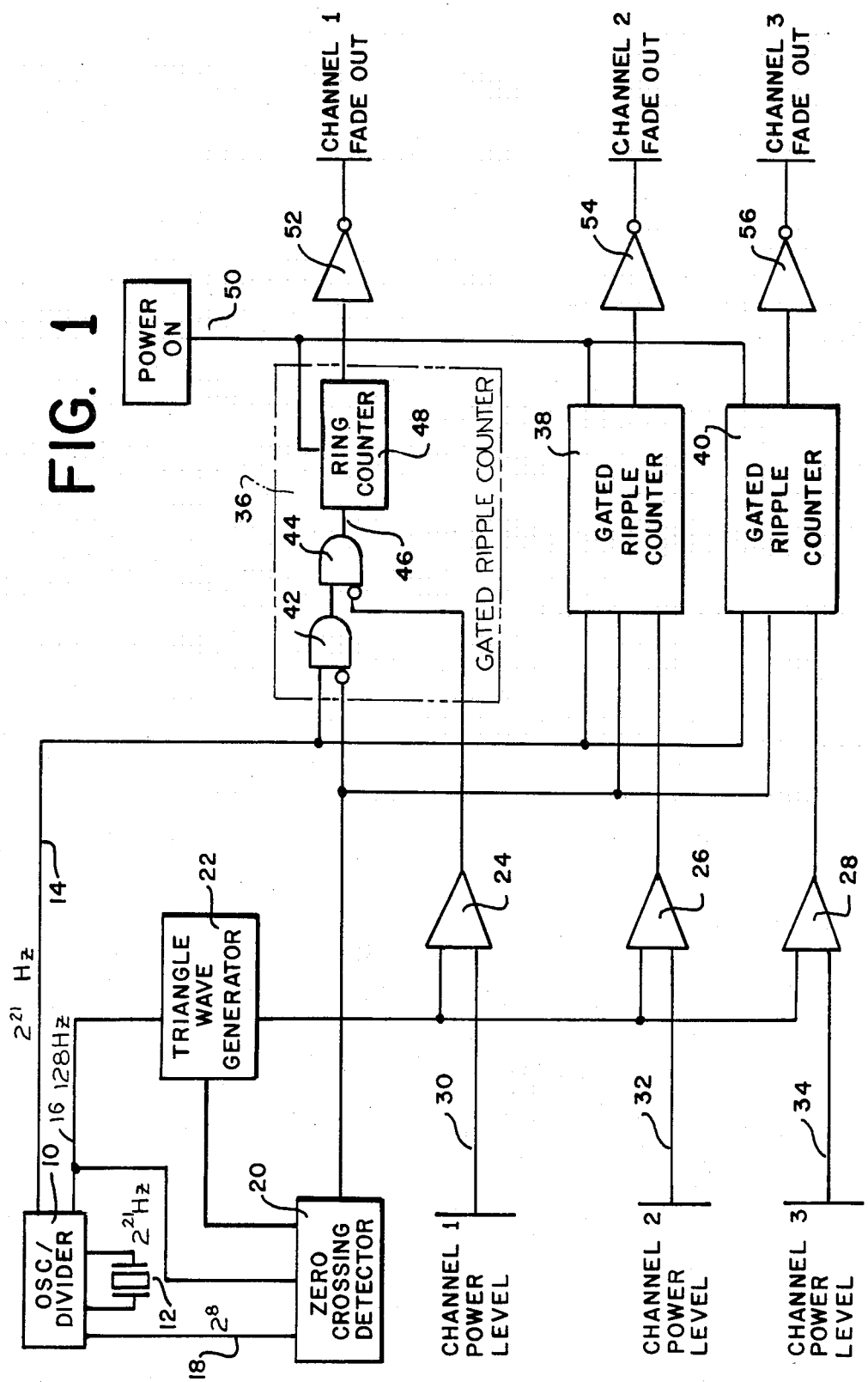
FIG. 1 is a block diagram of a three-channel voltage-to-frequency convertor for the practice of the present invention.

FIG. 1 is a block diagram of a circuit for the practice of the present invention. In FIG. 1 oscillator/divider 10 produces three output signals, preferably under the control of crystal 12 which provides frequency stability. Oscillator/divider 10 produces a square wave at the crystal frequency on bus 14. It provides a divided signal on bus 16 and another divided signal on bus 18. In a circuit that was built for the practice of the present invention, the frequency of crystal 12 and that of a square wave that was produced on bus 14 was $2^{21}$ Hz, or 2,097,152 Hz. This signal was divided by $2^{14}$ to produce a square wave at 128 Hz on bus 16 and it was divided by $2^{13}$ to produce a signal at 256 HZ on bus 18.

Both buses 16 and 18 are coupled to zero-crossing detector 20, and bus 16 is also coupled to triangle-wave generator 22 which generates a triangular wave at the clock frequency of 128 Hz. The triangular wave from triangular wave 22 is shown in FIG. 1 as being coupled to comparators 24, 26 and 28. Three such comparators are shown because that is the number used in the particular circuit in which the invention was applied. However, it will be seen that triangle wave generator 22 could be used to control a larger number of comparators, supplying a precision measurement for a plurality of inputs. In FIG. 1 three input terminals 30, 32 and 34 receive analog voltages corresponding to the power levels in three different circuits or channels. In the alternative the inputs could be voltage levels corresponding to VARs or any other quantity on which it was desired to make a conversion from voltage to frequency.

The outputs of comparators 24, 26 and 28 are taken respectively to gated ripple counters 36, 38 and 40. These three are identical so the description of gated ripple counter 36 will suffice for all. Gated ripple counter 36 includes an AND gate 42 which receives as inputs a square wave at $2^{21}$ HZ from bus 14 and an inverted output from zero-crossing detector 20. The output of AND gate 42 is taken to AND gate 44 which receives as a second input the inverted output of comparator 24. The effect is to produce on line 46 a signal that comprises square waves at a frequency of $2^{21}$ HZ during those time intervals when the triangular wave produced by triangular wave generator 22 is between its zero crossing and an amplitude corresponding to the voltage on input terminal 30. The result is to pass on line 46 a number of cycles of the high-frequency signal on bus 14 that is a function of the voltage on input terminal 30. The number of such pulses that is passed on line 46 is counted in ring counter 48 which is reset when power is turned on by a signal on line 50. The output of ring counter 48 is taken to inverter 52 where it provides a time-integrated measure of the power level at terminal 30. This time-integrated signal thus is proportional to watt-hours. Comparators 54 and 56 provide corresponding outputs for gated ripple counters 38 and 40 respectively.

Figure 2:
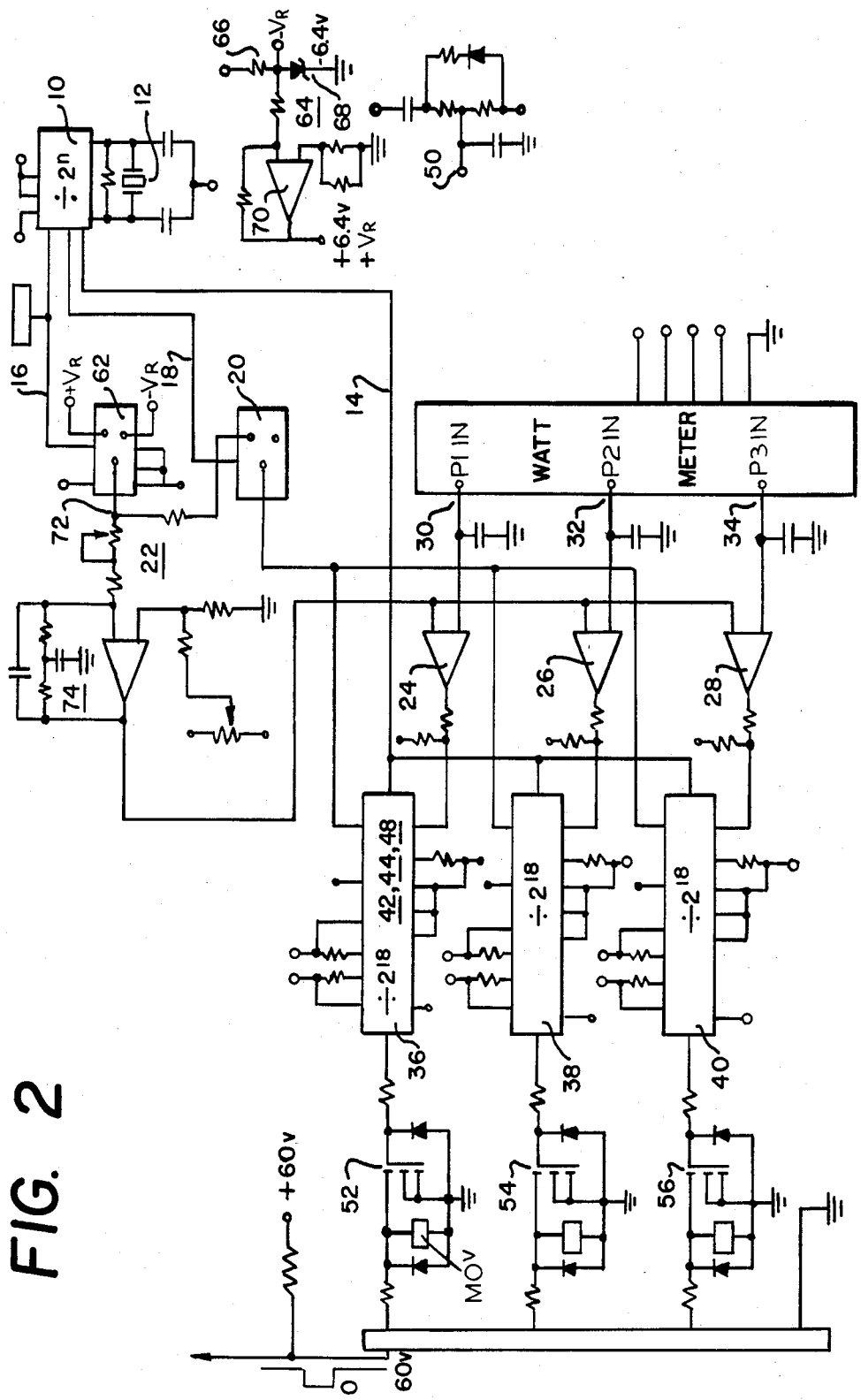
FIG. 2 is a detailed circuit diagram of the figure shown in block form in FIG. 1.

FIG. 2 is a detailed circuit diagram of a circuit that has been built for the practice of the present invention. In FIG. 2, numbers corresponding to elements used in FIG. 1 are identical and are mentioned here only when the function of a component is not obvious. Thus, zero-crossing detector 20 is a controlled switch that is switched between terminals in response to a square wave input at 256 Hz. Triangle wave generator 22 comprises a controlled switch 62 that is switched between positive and negative regulated voltages in response to a square wave at the system clock frequency of 128 Hz. Voltages for control switch 62 are derived from a 15-volt negative unregulated power supply by circuit 64. The negative voltage is applied through resistor 66 to Zener diode 68 to produce the negative regulated voltage. The positive regulated voltage is produced by inversion in operating amplifier 70. Control switch 62 is switched between these regulated voltages to produce on line 72 a square wave varying between plus 6.4 V and minus 6.4 V. This square wave is integrated in integrator 74 to produce the precision triangle wave.

In FIG. 2 input terminals 30, 32 and 34 are shown as taken from a wattmeter which supplied three inputs in the circuit that was built. Gated ripple counter 36 combines in one chip the functions of AND gates 42 and 44 and ring counter 48. The output of gated ripple counter 36 is inverted in a field-effect transistor that represents inverter 52. This actually represents a relay driver to register the counts from ring counter 48. The functions of protective diodes, metal-oxide varistors and coupling and dropping resistors are believed to be obvious to one of ordinary skill in the art.

Figure 3:
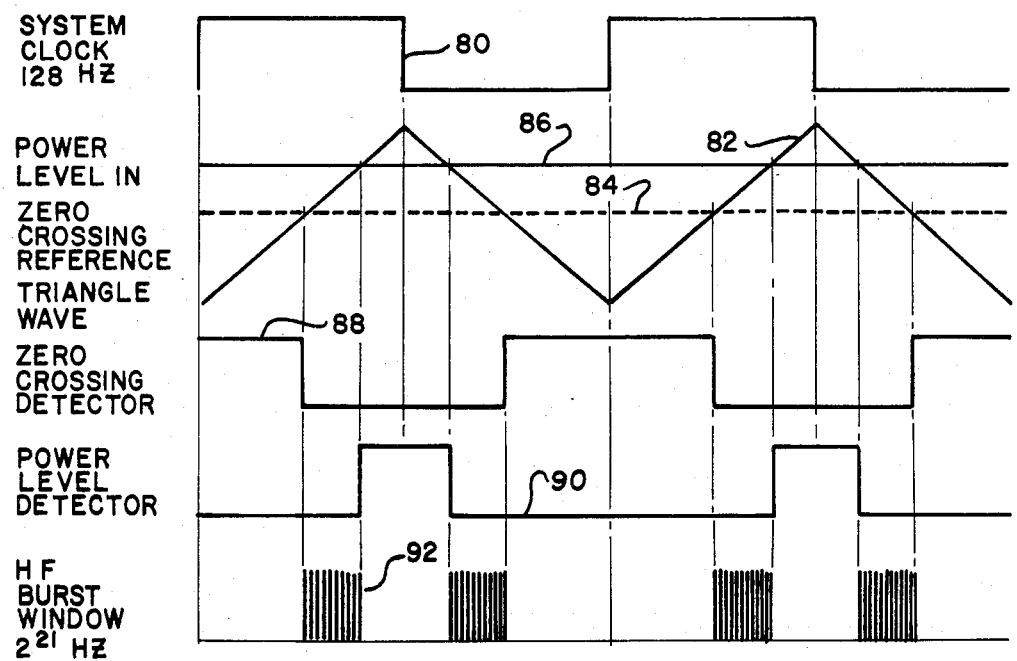
FIG. 3 is a set of wave forms as a function of time at various points in the circuit of FIG. 2.

FIG. 3 is a plot of various wave forms in the circuit of FIGS. 1 and 2. Each of the wave forms of FIG. 3 represents a plot of voltage as a function of time. Thus, wave form 80 is a square wave at the system clock frequency of 128 Hz, produced on bus 16 of FIG. 1 by oscillator/divider 10. Wave form 82 of FIG. 3 is the precision triangular wave that is produced by triangular wave generated 22. Also indicated in connection with wave form 82 is a zero reference level 84 and a power level 86. The distance between zero reference level 84 and power level 86 is a voltage corresponding to the power level that is being detected. Wave form 88 is a square wave at the clock frequency that represents the output of zero-crossing detector 20 of FIGS. 1 and 2. Wave form 88 undergoes transitions at the zero crossings of wave form 82. This could be done by a conventional zero-crossing detector or as shown in FIG. 2 by a switching signal derived from a square wave at twice the clock frequency. Wave form 90 at FIG. 3 is a signal that goes positive when the amplitude of wave form 82 exceeds power level 86. This is used as an inhibit signal in gated rippled counter 36. The result is to produce wave form 92 as an output of gated ripple counter 36. Wave form 92 contains square waves at the high frequency, $2^{21}$ Hz, whenever wave form 82, the precision triangular wave, is at a value between its zero crossing and the level of power level 86. The number of pulses in each clock cycle in wave form 92 is thus proportional to the amplitude of the voltage of power level 86, and a count of these pulses provides a frequency corresponding to the power level in a continuing count of the number of pulses in wave form 92 and is thus proportional to watt-hours.

I claim:

1. A circuit for developing a digital signal that is an integrated measure of an analog voltage comprising:

a source of a signal at a relatively high frequency;
a clock signal that is divided from the high-frequency signal;
means for developing a triangular wave at the clock frequency;
means for starting a measure of a time interval at a zero-crossing of the triangular wave;
means for stopping a measure of the time interval when the triangular wave has an amplitude equal to the analog voltage
means for obtaining a count of cycles of the high-frequency during the time interval; and,
means for accumulating the count as a function of time, which accumulated count is a measure of the integrated analog signal.

2. The circuit of claim 1 wherein the relatively high-frequency is about $2^{21}$ Hz and the clock signal is divided from the high-frequency signal to approximately 128 Hz.

3. A circuit as in claim 1 wherein said means for developing a triangular wave at the clock frequency comprises:

a precision voltage reference source having a positive potential;
a precision voltage reference source having a negative potential;
a switching circuit having a first input connected to said precision voltage source having a positive potential, and having a second input connected to said precision voltage source having a negative potential, and having an output capable of being switched between either said first input or said second input, thereby producing alternately a positive precision voltage output or a negative precision voltage output, said switching circuit being driven by a gate pulse derived by dividing down said signal;
an integrator having an input connected to said output of said switching circuit, said input therefore switched between said positive precision voltage reference and said negative precision voltage reference, and an output of said integrator being said triangular wave, said triangular wave therefore being timed by said signal and said triangular wave having a precision amplitude determined by said first precision voltage reference and said second precision voltage reference.

4. A circuit as in claim 3 wherein said precision voltage reference source having a negative potential and said precision reference source having a positive potential both have potentials of the same magnitude.

5. A circuit for producing a digital output signal corresponding to watt-hours in response to an analog input voltage corresponding to watts, the circuit comprising:

a. an oscillator/divider producing as outputs a
square wave at a frequency in excess of 1 MHz and a clock signal that is a square wave produced by division from the high-frequency output signal, the clock signal being at about 128 Hz;
b. a triangle-wave generator connected to the oscillator/divider to produce a triangular wave at the clock frequency;
c. a zero-crossing detector connected to the oscillator/divider and to the triangle-wave generator to produce a signal at times when an output of the triangle-wave generator passes through zero volts;
d. a gate connected to the oscillator/divider, the triangle-wave generator, the analog input voltage and the zero-crossing detector, the gate being on when the output of the triangle-wave is between zero and the value of the input voltage;

e. a counter connected to the gate to count cycles of the high-frequency signal when the gate is enabled; and f. means for coupling the output of the counter to an external circuit.

* * * * *